United States Patent
Kim et al.

(10) Patent No.: US 11,714,356 B2
(45) Date of Patent: Aug. 1, 2023

(54) BAKE UNIT AND APPARATUS FOR TREATING SUBSTRATE

(71) Applicant: Semes Co., Ltd, Cheonan-si (KR)

(72) Inventors: Jun Ho Kim, Seongnam-si (KR); Sang Hoon Lee, Suwon-si (KR); Jong Seok Seo, Cheonan-si (KR); Ho Jin Jang, Cheonan-si (KR); Gyeong Won Song, Cheonan-si (KR)

(73) Assignee: SEMES CO., LTD., Chungcheongnam-Do (KR)

(*) Notice: Subject to any disclaimer, the term of this patent is extended or adjusted under 35 U.S.C. 154(b) by 0 days.

(21) Appl. No.: 17/469,366

(22) Filed: Sep. 8, 2021

(65) Prior Publication Data
US 2022/0075270 A1 Mar. 10, 2022

(30) Foreign Application Priority Data
Sep. 10, 2020 (KR) .................. 10-2020-0116381

(51) Int. Cl.
*G03F 7/40* (2006.01)
*G03F 7/20* (2006.01)
*G03F 7/00* (2006.01)
*G03F 7/38* (2006.01)

(52) U.S. Cl.
CPC .............. *G03F 7/40* (2013.01); *G03F 7/38* (2013.01); *G03F 7/70933* (2013.01)

(58) Field of Classification Search
CPC ........... G03F 7/40; G03F 7/38; G03F 7/70933
See application file for complete search history.

(56) References Cited

U.S. PATENT DOCUMENTS 8,025,925 B2 * 9/2011 Fukuoka ........... H01L 21/67109
　　　　　　　　　　　　　　　　　　　　118/724
8,782,918 B2 * 7/2014 Aoki ................. H01L 21/67109
　　　　　　　　　　　　　　　　　　　　134/10

FOREIGN PATENT DOCUMENTS

| JP | 2016-115919 A | 6/2016 |
| KR | 100488547 B1 | 5/2005 |
| KR | 101909481 B1 | 10/2018 |
| KR | 101935945 B1 | 1/2019 |

OTHER PUBLICATIONS

Korean Office Action for corresponding Korean Patent Application No. 10-2020-0116381 dated Feb. 1, 2023.

* cited by examiner

*Primary Examiner* — Hung V Nguyen
(74) *Attorney, Agent, or Firm* — Harness, Dickey & Pierce, P.L.C.

(57) ABSTRACT

The inventive concept provides a bake unit. The bake unit comprising: a housing having an upper cover and a lower frame, the upper cover and the lower cover in combination providing a treatment space for heat treatment of a substrate; a heater provided in the treatment space for heating a substrate placed thereon; a heater cup configured to surround the heater; and a first purge gas supply unit for providing a first purge gas flow to block inflow of outer air through a gap between the lower frame and the heater cup.

20 Claims, 8 Drawing Sheets

BAKE UNIT AND APPARATUS FOR TREATING SUBSTRATE

CROSS-REFERENCE TO RELATED APPLICATIONS

A claim for priority under 35 U.S.C. § 119 is made to Korean Patent Application No. 10-2020-0116381 filed on Sep. 10, 2020, in the Korean Intellectual Property Office, the entire contents of which are hereby incorporated by reference.

BACKGROUND

Embodiments of the inventive concept described herein relate to an apparatus for treating substrate, and more specifically an apparatus for heat treatment of a substrate.

To manufacture a semiconductor device, various processes are performed such as photolithography, etching, deposition, ion implantation, cleaning, etc. Among these photolithography forms a pattern and plays an important role in achieving a high intensity integration of a semiconductor device.

The photolithography is largely divided into an application process, exposure process, and development process, and a baking process is carried out before and after the exposure process. The baking process is a heating process of a substrate: when a substrate is placed on a heating plate, the substrate is heat treated by a heater provided inside the heating plate.

In the baking process a uniform temperature of an air flow above the substrate is extremely important. The air flow temperature above the substrate is one of the crucial factors which determines the process throughput.

In the chamber used in existing bake units possess, an air flow may be unevenly supplied in the upper inner space of the chamber due to structural problems.

If the supply flow rate of processing gas is increased to raise an etch rate, the air flow in the upper inner space of the chamber is supplied unevenly, which worsens the unevenness of thickness uniformity. On the contrary, if the supply flow rate of processing gas is decreased in order to resolve issues of unevenness in thickness uniformity, there is a rise of the inflow rate of outside air coming through a gap at the bottom side of lower portion of the chamber so the etch rate declines.

SUMMARY

Embodiments of the inventive concept provide a bake unit and substrate treating apparatus that may improve the evenness in temperature and air flow above a substrate.

Embodiments of the inventive concept also provide a bake unit and substrate treating apparatus which have a feature to provide purge gas from below the bottom side of the heater.

Embodiments of the inventive concept provides a bake unit and substrate treating apparatus that can block the inflow of outside air above the substrate.

Embodiments of the inventive concept provide a bake unit and substrate treating apparatus that can steadily maintain the temperature above the substrate.

The technical objectives of the inventive concept are not limited to the above-mentioned ones, and the other unmentioned technical objects will become apparent to those skilled in the art from the following description.

In an aspect of the embodiments of the inventive concept, a bake unit comprises: a housing with an upper cover and a lower frame that provide in combination a space for heat treatment of a substrate; a heater provided in the heat treatment space for heating a substrate placed thereon; a heater cup provided to surround the heater; and a first purge gas supply unit for supplying a first purge gas flow to block the inflow of outside air coming through a gap between the lower frame and the heater cup.

In some embodiments, the first purge gas supply unit may include a gas input space in the sidewall of the lower frame for the first purge gas to flow thereinto; and outlets configured to allow the first purge gas inflowed into the input space to be discharged into the gap between the heater cup and the lower frame.

In some embodiments, the outlets may be provided to face the side of the heater cup.

In some embodiments, the bake unit may further comprise a heat insulating cup spaced apart from the lower surface of the heater cup and a second purge gas supply unit wherein the second purge gas supply unit provides a second purge gas flow that blocks the inflow of outside air coming through a plurality of through-holes formed at the bottom side of the insulation cup and the bottom side of the heater cup.

In some embodiments, the bake unit may further comprise a support member that supports the heater through the plurality of through-holes.

In some embodiments, the heat insulation cup has an inner space, and the second purge gas supply unit may supply the second purge gas into the inner space of the heat insulating cup.

In some embodiments, the bake unit may further comprise a baffle unit for spraying a processing gas onto the substrate placed on the heater, the baffle unit comprising an upper plate having a plurality of first spray holes; and a lower plate having a plurality of second spray holes, the lower plate disposed below the upper plate.

In some embodiments, the first spray holes can be relatively smaller in size and/or lower in number than the second spray holes.

In some embodiments, the baffle unit may further comprise a central exhaust part which forms an exhaust flow in the central area of the processing space; and a peripheral exhaust part which forms an exhaust flow in the peripheral area of the processing space.

In some embodiments, the first purge gas and the second purge gas can be an inert gas with a constant temperature.

In another aspect of embodiments of the inventive concept, a substrate treatment apparatus comprises: a chamber with an inner space; a bake unit provided within the chamber and providing a heat treatment space for a substrate bake processing; and a cooling unit for cooling a substrate, the cooling unit provided at one side of the bake unit, and wherein the bake unit comprises: a housing with an upper cover and lower frame that provide in combination a space for heat treatment of a substrate; a heater provided in the heat treatment space for heating a substrate placed thereon; a heater cup provided to surround the heater; and a first purge gas supply unit for supplying a first purge gas flow to block the inflow of outside air coming through a gap between the lower frame and the heater cup.

In some embodiments, the first purge gas supply unit may include a gas input space in the sidewall of the lower frame for the first purge gas to flow thereinto; and outlets configured to allow the first purge gas inflowed into the input space to be discharged into the gap between the heater cup and the lower frame, the outlet facing the side of the heater cup.

In some embodiments, the bake unit further comprises a heat insulation cup placed apart from the lower surface of the heater cup; support members for supporting the heater through a plurality of through-holes formed at the bottom side of the heater cup and the bottom side of the heat insulation cup; and a second purge gas supply unit for supplying a second purge gas flow to block the inflow of outside air coming through the plurality of through-holes.

In some embodiments, the heat insulation cup may have an inner space, and the second purge gas supply unit provides the second purge gas into the inner space of the heat insulation cup.

In some embodiments, the bake unit further comprises a baffle unit for spraying a processing gas onto a substrate placed on the heater, wherein the baffle unit comprises: an upper plate with a plurality of first spray holes; and a lower plate with a plurality of second spray holes, the lower plate disposed below the upper plate.

In some embodiments, the first spray holes may be relatively smaller in size and/or lower in number than the second spray holes.

In still another aspect of the embodiments of the inventive concept, a bake unit comprises: a housing with an upper cover and lower frame that provide in combination a processing space for heat treatment of a substrate; a heater provided inside the processing space for heating a substrate placed thereon; a heater cup provided to surround the heater; a heat insulation cup spaced apart from a lower surface of the heater cup; support members for supporting the heater through a plurality of through-holes formed at the bottom side of the heater cup and the bottom side of the insulation cup; a first purge gas supply unit for providing a first purge gas flow to block the inflow of outside air coming through a gap between the lower frame and the heater cup; a second purge gas supply for providing a second purge gas flow to block the outside air coming through the plurality of through-holes; and a baffle unit for spraying a processing gas onto a substrate placed on the heater.

In some embodiments, the first purge gas supply unit may include a gas input space in the side wall of the lower frame for the first purge gas to flow thereinto; and outlets configured to allow the first gas flowed into the input space to be discharged into a gap between the heater cup and the lower frame, the outlets facing the side of the heater cup.

In some embodiments, the second purge gas supply unit may provide the second purge gas into the inner space of the heat insulation cup.

In some embodiments, the baffle unit comprises: an upper plate with a plurality of first spray holes; and a lower plate with a plurality of second spray holes, the lower plate disposed below the upper plate, wherein the first spray holes are relatively smaller in size and/or lower in number than the second spray holes.

According to some embodiments, the purge gas provided through the first and second purge gas supply units advantageously improve uniformity in the temperature and air flow above the substrate.

According to some embodiments, the inflow of outside air coming through a gap in the lower frame can be blocked.

According to some embodiments, the temperature of the upper portion of the substrate can be maintained constantly.

According to some embodiments, the etching rate can be improved by regulating the volume of purge gas supplied through the first and second purge gas supply units.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings. The inventive concept is not limited to the embodiments disclosed below, but may be implemented in various forms. The embodiments of the inventive concept are provided to make the disclosure of the inventive concept complete and fully inform those skilled in the art to which the inventive concept pertains of the scope of the inventive concept.

The equipment of an embodiment of the inventive concept may be used to perform photolithography processes on substrates, such as semiconductor wafers or flat panel displays.

Especially the equipment of an embodiment of the inventive concept may connect with an exposure apparatus to perform application and development processes on the substrate. As an exemplary only, embodiments of the inventive concept will be described below in case of semiconductor wafer substrates.

Figure 1:
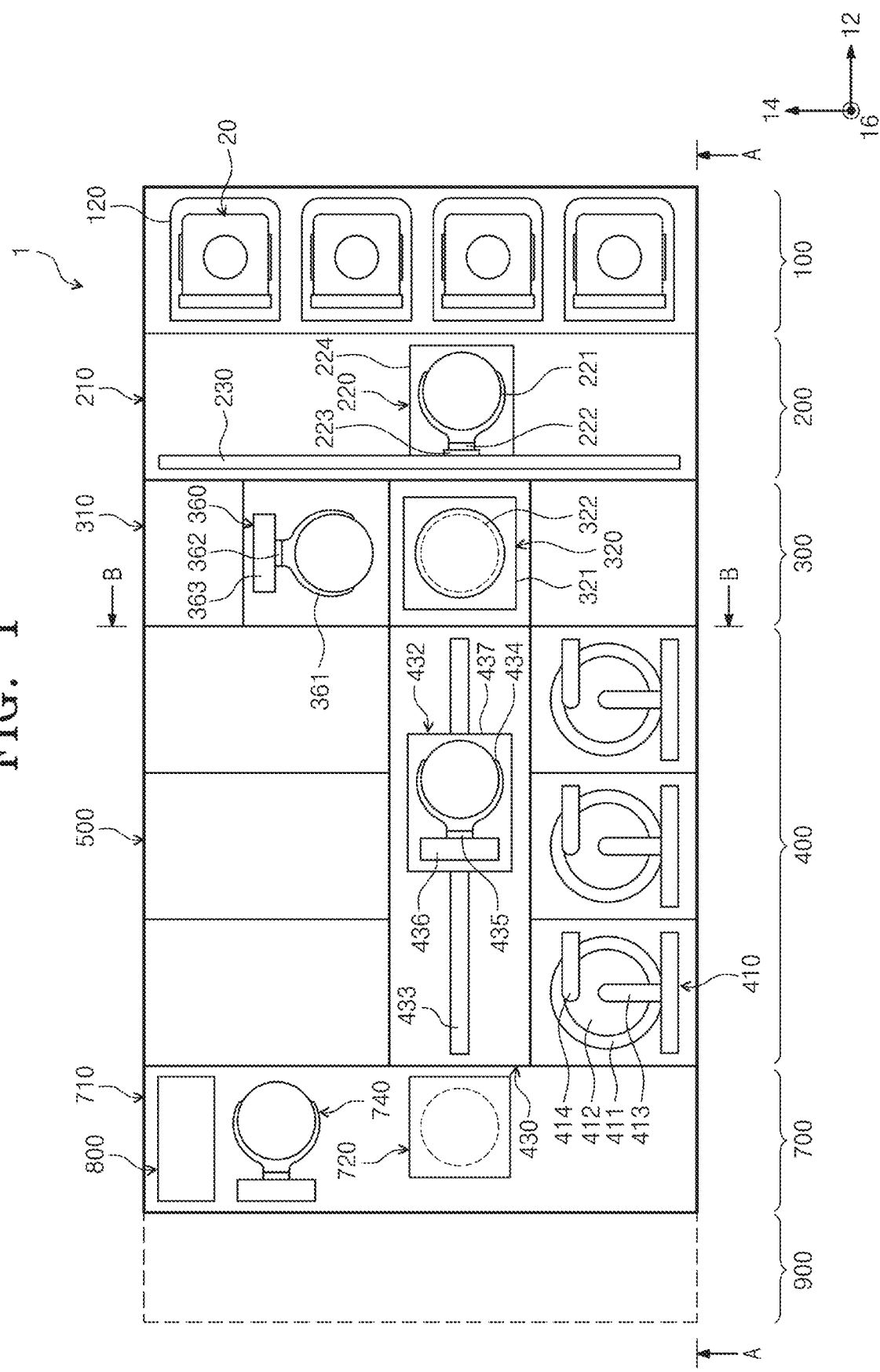
FIG. 1 shows schematically a substrate treating apparatus according to an embodiment of the inventive concept.
Figure 2:
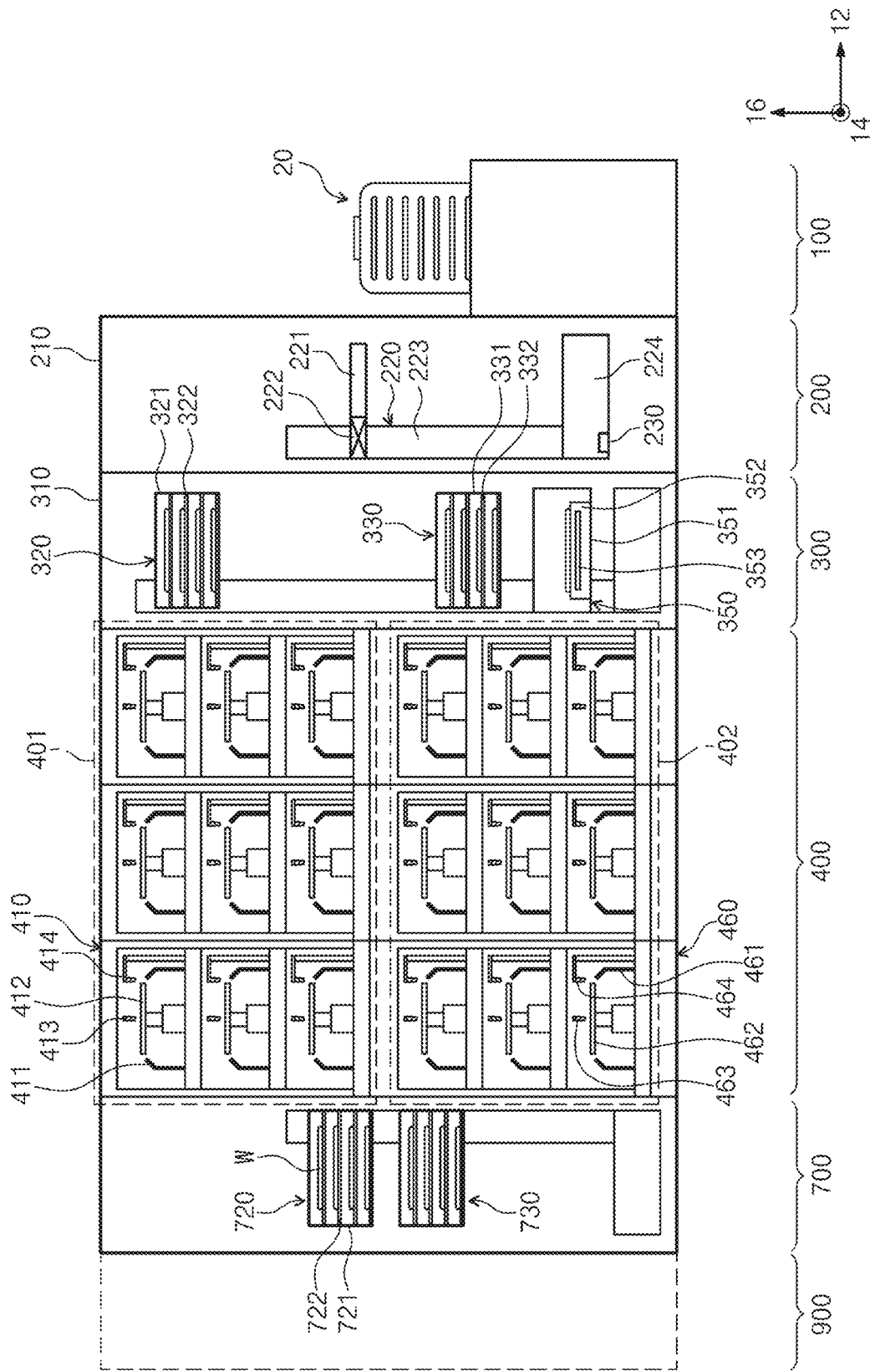
FIG. 2 is view from direction A-A of the substrate treating apparatus (1) in FIG. 1.
Figure 3:
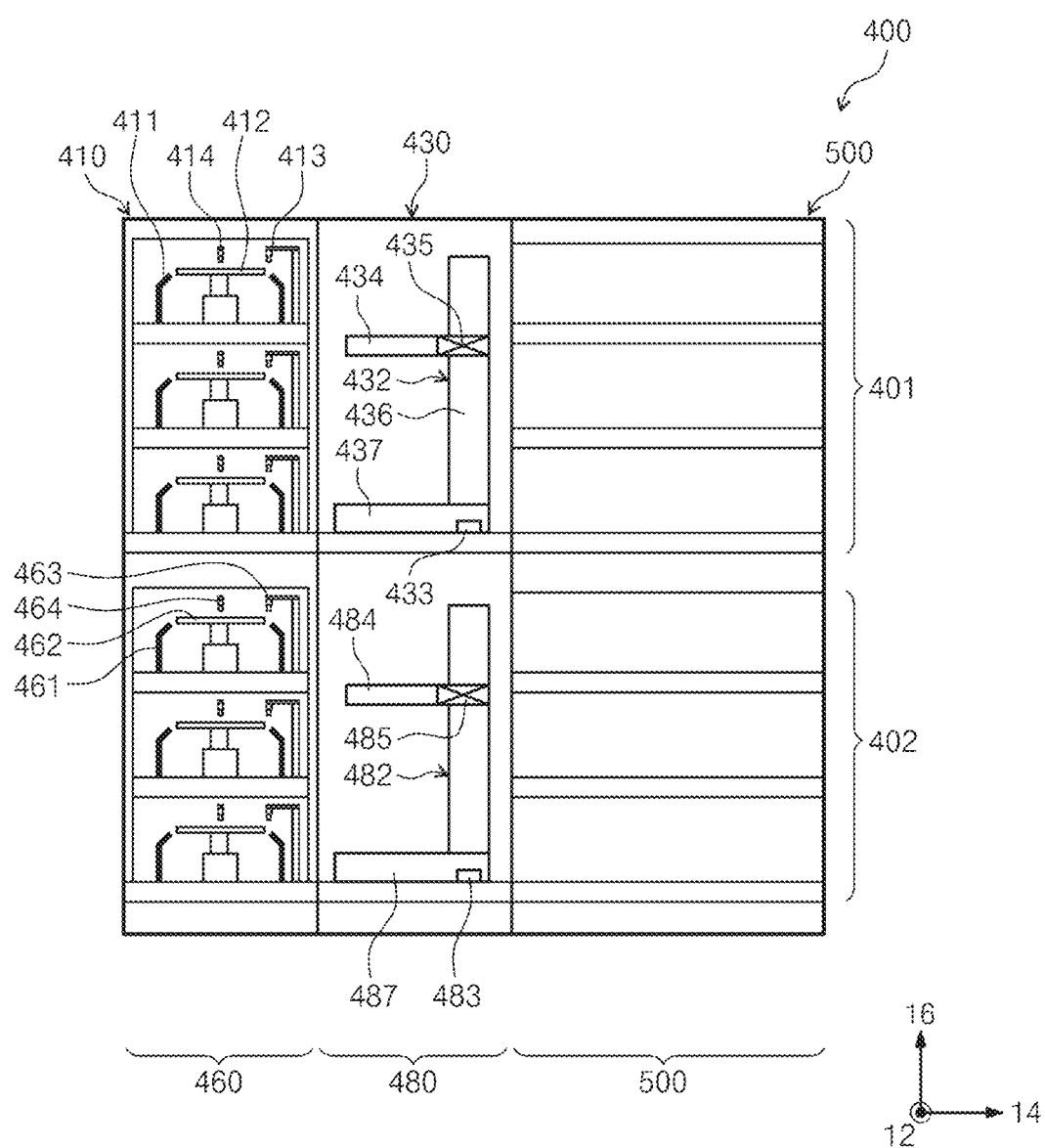
FIG. 3 is view from B-B of the substrate treating apparatus (1) in FIG. 1.

FIG. 1 and FIG. 3 schematically shows a substrate treating apparatus (1) according to an embodiment of the inventive concept. FIG. 1 is a view from the upper side of the substrate treating apparatus (1), FIG. 2 is a view from direction A-A of the substrate treating apparatus (1) in FIG. 1, and FIG. 3 is a view from direction B-B of the substrate treating apparatus (1) in FIG. 1.

Referring to FIG. 1 to FIG. 3, the substrate treating apparatus (1) includes a road port 100, index model 200, buffer module 300, application and development module 400, interface module 700, and a purge module 800. The road port 100, index module 200, buffer module 300, application and development module 400 and interface module 700 are sequentially arranged in a row. The purge module 800 can be provided inside the interface module 700. The purge module 800 can be provided in various places such as a location to which exposure apparatus connects behind the interface module 700 or a side of the interface module 700.

Hereinafter, a direction in which the road port 100, index module 200, buffer module 300, application and development module 400, and the interface module 700 are arranged will be referred to as a first direction 12. A direction that is perpendicular to the first direction 12 when viewed from above will be referred to as a second direction 14, and a direction that is perpendicular to both the first direction 12 and the second direction 14 will be referred to as a third direction 16.

Being stored in a cassette 20, the substrate W is transferred. The cassette 20 has a structure that can be sealed off from the outside. For example, a front open unified pod (FOUP) with a complete open door may be used for the cassette 20.

Hereinafter, the road port 100, index module 200, buffer module 300, application and development module 400, interface module 700, and purge module 800 will be explained.

The road port 100 has a placement stage 120 on which the cassette storing substrates W is placed. The placement stage 120 is provided in a plural number, and the placement stages 120 are arranged in the second direction 14. In an embodiment shown in FIG. 1, four placement stages 120 are provided.

The index module 200 transfers the substrate W between the cassette 20 placed on the placement stage 120 of the road port 100, and the buffer module 300. The index module 200 includes a frame 210, an index robot 200, and a guide rail 230. The frame 210 is generally provided in the shape of an empty rectangular parallelepiped. The frame 210 is arranged between the road port 100 and the buffer module 300. The frame 210 of the index module 200 may be provided in a height lower than the frame 310 of the buffer module 300 which will be explained further on. An index robot 220 and a guide rail 230 are provided inside the frame 210. The index robot 220 has a hand 221 which directly handles substrate W and is a multi-axes driven structure movable in the first direction 12, second direction 14, and third direction 16, and rotatable. The index robot 220 includes a hand 221, an arm 222, a support 223, and a base 224. The hand 221 is fixedly installed to the arm 222. The arm 222 is provided in a structure that may be expandable and contractable, and rotatable. The support 223 is arranged with its length extending along in the third direction 16. The arm 222 is connected to and movable on the support 223. The support 223 is fixedly connected to the base 224. The guide rail 230 is arranged with its length extending along the second direction 14. The base 224 is connected to the guide rail 230 and linearly movable on the guide rail 230. Also, although not shown, a door opener which opens and closes the door of the cassette 20 is provided in the frame 210.

The buffer module 300 includes a frame 310, a first buffer 320, a second buffer 330, a cooling chamber 350, and a first buffer robot 360. The frame 310 is provided in the shape of an empty rectangular parallelepiped, and is arranged between the index module 200 and the application and development module 400. The first buffer 320, the second buffer 330, the cooling chamber 350, and the first buffer robot 360 is provided within the frame 310. The cooling chamber 350, the second buffer 330, and the first buffer 320 are arranged sequentially from bottom in the third direction 16. The first buffer 320 is provided at the same position as the application module 401 of the application and development module 400, which will be described in the following. The second buffer 330 and cooling chamber 350 are provided at the same position as the development module 402 of the application and development module 400, which will be described in the following. The first buffer robot 360 is placed a certain distance away from the second buffer 330, cooling chamber 350, and the first buffer 320 in the second direction 14.

The first buffer 320 and the second buffer 330 temporarily store a plurality of substrates W. The second buffer 330 has a housing 331 and a plurality of supports 332. The supports 332 are arranged within the housing 331, and are spaced apart from one another in the third direction 16. A single substrate W is placed on each of the supports 332. The housing 331 has openings (not shown) facing the index robot 220 and the first buffer robot 260 such that the index robot 220 and the first buffer robot 260 can bring substrates W into/out of the support 332 within housing 331. The first buffer 320 generally has a similar structure to the second buffer 330, i.e., the housing 321 of the first buffer 320 has openings facing the first robot 360 and an application robot 432 provided in the application module for transferring wafer W therebetween. The number of supports 322 provided in the first buffer 320 and the number of supports 332 provided in the second buffer 330 may be the same or different. In an embodiment, the number of supports 332 provided in the second buffer 330 may be greater than the number of supports 332 provided in the first buffer 320.

The first buffer robot 360 transfers the substrate W between the first buffer 320 and the second buffer 330. The first buffer robot 360 includes a hand 361, an arm 362, and a support 363. The hand 361 is fixedly installed to the arm 362. The arm 362 is provided in a structure which can be expandable and contractable, such that the hand can move in the second direction 14. The arm 362 is movably connected to the support 363 and the arm linearly moves on the support 363 in the third direction. The support 363 has a length extending between the point corresponding to the position of second buffer 330 and the point corresponding to the position of first buffer. The support 363 may extend further upwardly or downwardly. The first robot 360 can be provided as two-axes driven structure such that the hand 361 moves in the second direction 14 and the third direction 16.

The cooling chamber 250 cools each of the substrates W. The cooling chamber 250 includes a housing 351 and a cooling plate 352. The cooling plate 352 includes a top surface on which the substrate W is placed and a cooling member 350 for cooling the substrates W. The cooling member 353 may utilize various cooling methods such as using cooling water or thermoelectric devices. The cooling chamber 350 may be further provided with a lift pin assembly, which places a substrate W on the cooling plate 352. The housing 351 may have openings facing the index robot 220 and a robot provided in the development module can bring substrates W onto or out of the cooling plate 352. Further, the cooling chamber 350 is provided with doors which open and closes aforementioned openings.

The application module 401 performs processes such as applying photosensitive solution for example photoresist solution on the substrate W and heat treatment processes such as heating and cooling substrate W before and after photoresist application processes. The application module 401 has a chemical processing chamber 410, a heat treatment chamber 500, and a transfer chamber 430. The chemical processing chamber 410, a heat treatment chamber 500, and the transfer chamber 430 are sequentially arranged in the second direction 14. The chemical processing chamber 410 may be provided as a resist application chamber 410 which applies photoresist solution onto the substrate W. A plurality of photoresist application chambers 410 are provided, and a plurality of resist application chambers 410 are provided in the first direction 12 and in third direction 16, respectively. The heat treatment chamber 500 is provided with a plurality of resist application chamber in the first direction 12 and in the third direction 16, respectively.

The transfer chamber 430 is arranged side by side with the first buffer 320 of the first buffer module 300 in the first direction 12. An application robot 432 and a guide rail 433 are provided in the transfer chamber 430. The transfer chamber 430 usually has the shape of a rectangle. The application robot 432 transfers the substrate W among heat treatment chambers 500, resist application chamber 410, and the first buffer 320 of the first buffer module 300. The guide rail 433 is arranged with its length extending along the first direction 12. The guide rail 433 guides the application unit robot 432 to move linearly (i.e., move back and forth) in the first buffer direction. The application robot 432 has a hand 434, an arm 435, a support 436, and a base 437. The hand 434 is fixedly installed to the arm 435. The arm 435 is provided in a structure that may be expandable and contractable such that the hand 434 may move horizontally. The support 436 is arranged with its length extending along the third direction 16. The arm is connected to the support 436 such that it may linearly move on the support 436 in the third direction 16. The support 436 is fixedly installed to the base 437, and base 437 is connected to the guide rail 433 so as to be movable along the guide rail 433.

The resist application chambers 410 have the same structure. However, photoresists used in each resist application chamber 410 may be different. In an embodiment, chemical amplification resist can be used as photoresist. The resist application chamber 410 applies photoresist onto the surface of the substrate W. The resist application chamber 410 has a housing 411, a support plate 412, and a nozzle 413. The housing 411 has the shape of a cup with an opened upper side. The support plate 412 is provided inside the housing 411, and supports the substrate W. The support plate 412 is provided to be rotatable. The nozzle 413 provides photoresist onto the surface of the substrate W disposed on the support plate 412. The nozzle 413 has a circular tube shape, and can provide photoresist onto the center of the substrate W. Alternatively the nozzle 413 may have a length corresponding to the diameter of the substrate W, and the outlet of the nozzle 413 may be provided in a slit. Also, another nozzle can be provided in the resist application chamber 410 to supply cleaning solutions such as deionized water to clean the surface of the substrate W which has been treated with photoresist.

Referring to FIG. 1 or FIG. 3, the development module 402 performs a development process for supplying a development solution to remove part of the photoresist, thereby achieve a pattern on the surface of the substrate W, and a heat treatment process such as heating or cooling the substrate W before and after the development process. The development module 402 has a liquid (chemical) processing chamber 460, a heat treatment chamber 500, and a transfer chamber 480. The liquid processing chamber 460, the heat treatment chamber 500, and the transfer chamber 480 are arranged sequentially in the second direction 14. The liquid chamber 460 may be provided as the development chamber. The development chamber 460 and the heat treatment chamber 500 are arranged in the second direction 14 with the transfer chamber 480 therebetween them. The development chambers 460 are provided in a plurality arranged in the first direction 12 and third direction 16, respectively.

The transfer chamber 480 is placed side by side with the second buffer 330 of the first buffer module 300 in the first direction 12. Inside the transfer chamber 480 there is the development robot 482 and the guide rail 483. The transfer chamber usually has the shape of a rectangle. The development robot 482 moves the substrate W among the bake units 500, the development chambers 460, the second buffer 330 of the first buffer module 300, and the cooling chamber 350. The length of the guide rail 483 is extending along the first direction 12. The guide rail guides the development robot to move linearly in the first direction 12. The development robot 482 has a hand 484, an arm 485, a support 486, and a base 487. The hand 484 is fixedly installed to the arm 485. The arm 485 is expandable and contractable so the hand 484 moves horizontally. The length of support 486 is extending along the third direction 16. The arm 485 connects with the support 486 to move linearly in the third direction 16. The support 486 is fixedly installed to the base 487. The base 487 combines with the guard rail 483 so that it may move along the guard rail 483.

The development chambers 460 all have the same structure. However, each of the development liquids used in each of the development chambers 460 may be different to one another. The development chamber 460 may remove the light-irradiated portions of the photoresist applied on the surface of the substrate W. At this time, the light-irradiated portions of the protective layer may be removed, too. Depending on the kind of photoresist, the portions of the photoresist and protective layer that are not light-irradiated may be removed.

The development chamber 460 has a housing 461, a support plate 462, and a nozzle 463. The housing 461 has a shape of a cup with an opened upper part. The support plate 462 is disposed in the housing 461, and supports the substrate W. The support plate is rotatably provided. The nozzle 463 provides the development liquid onto the substrate W. The nozzle 463 has the shape of a circular tube, and can supply development liquid onto the center of the substrate W. Alternatively, the nozzle may have a length which matches the diameter of the substrate W, and the outlet of the nozzle 463 may be a slit. Also, a nozzle that supplies cleaning liquid 464 such as deionized water may be additionally provided in the development chamber 460 to clean the surface of the substrate W.

The heat treatment chamber is provided in the development module 402 is generally provided in the same way as the bake unit 500 which is mentioned before.

As aforementioned, the applying module 401 and the development module 402 are provided so that they can be separated from each other in the application and development module 400. Also, when seen from above, the application module 401 and the development module 402 can have the same chamber arrangement.

The interface module 700 transfers the substrate W. The interface module 700 includes a frame 710, a first buffer 720, a second buffer 730, and an interface robot 740. The first buffer 720, the second buffer 730, and the interface robot 740 are provided within the frame 710. The first buffer 720 and the second buffer 730 are stacked with being apart from each other. The first buffer 720 is stacked over the second buffer 730.

The interface robot 740 is spaced apart from the first buffer 720 and the second buffer 730 in the second direction 14. The interface robot 740 transfers the substrate W among the first buffer 720, the second buffer 730, and the exposure apparatus 900.

The first buffer temporarily stores the processed substrates W before they are moved to the exposure apparatus 900. Also, the second buffer 730 temporarily stores the substrates W which have been processed in the exposure apparatus before they are moved to other apparatus for further processing. The first buffer 720 has a housing 721 and a plurality of supports 722. The supports 722 are provided within the housing 721 and are spaced apart from each other in the third direction. One substrate W is placed on each support 772. The housing 721 has openings facing the interface robot 740 and the preprocessing robot 632, so that the interface robot 740 and the preprocessing robot may bring substrates W into or out of the housing 721 through the openings and then onto or out of the support 722. The second buffer 730 has a structure similar to that of the first buffer 720 for transferring substrate W. Only buffers and robots as like mentioned above may be provided in the interface model without chamber which performs any processing on the wafer.

Figure 4:
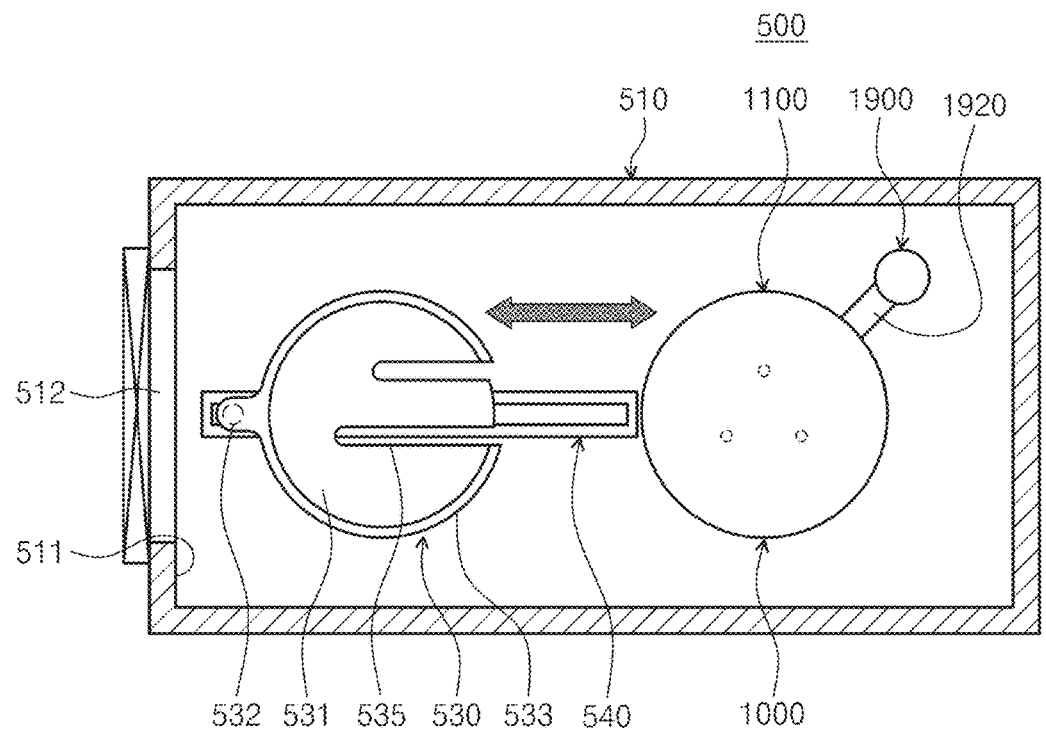
FIG. 4 is a top plan view of a heat treatment chamber.
Figure 5:
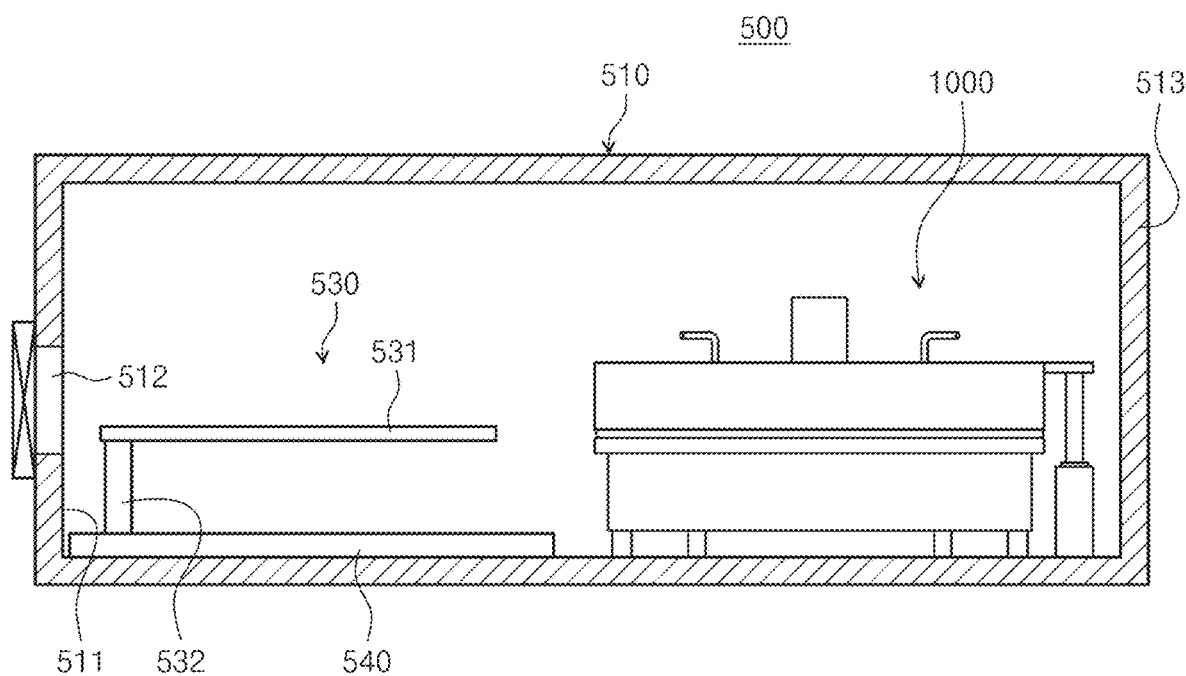
FIG. 5 is a side cross-sectional view of a heat treatment chamber.

FIG. 4 is a top plan view illustrating the heat treatment chamber, and FIG. 5 is a side cross sectional view illustrating the heat treatment chamber of FIG. 4.

Referencing FIG. 4 and FIG. 5, the heat treatment chamber 500 may include housing 510, a cooling unit 530, and a bake unit 1000.

Housing 510 provides an inner space. The housing 510 is provided in a rectangular shape. The housing 510 includes a first side wall 511, a second side wall 513, and an entrance 512. Inside the housing 510 the cooling unit 530 and the bake unit 1000 are arranged side by side.

The first side wall 511 is provided in one side of housing 510. The second side wall 513 is provided in the housing 510 at the opposite side of the first side wall 511. The first side wall 511 of housing 510 has the entrance 512 through which the substrate W enters into or exits out of the housing 510. The entrance 512 provides a passage for the substrate W.

The cooling unit 530 cools the substrate W which has been processed in the bake unit 1000. The cooling unit 530 includes a cooling plate 531 and a transfer unit 540 which moves the cooling plate 530. In an embodiment a cooling flow path may be provided in the interior of the cooling plate 531. Cooling water may be provided to the cooling flow path so that it may cool the substrate W and cooling plate 531. The transfer unit 540 transfers the cooling plate 531 within housing 510. The cooling plate 531 may be moved to the standby position and cooling position by the transfer unit 540. The standby position may be a position near the entrance (illustrated in FIG. 4), and the cooling position may correspond to a position above the heating plate.

The substrate W is placed on the cooling plate 531. The cooling plate 531 is provided in a circular shape. The cooling plate 531 may be provided in the same size as the substrate W. The cooling plate 531 may be provided in a metal material with good thermal conductivity. The cooling plate 531 is provided with a guide hall 535. The guide hall 535 is extending inwardly from the exterior side (edge) of the cooling plate. The guide hole 535 allows that the cooling plate 531 does not interfere or collide with the lift pin 553 when the cooling plate 531 moves. The cooling plate may be provided with a flow path through which cooling refrigerant flow.

The arm 532 is fixedly connected to the cooling plate 531. The arm 532 is provided between the cooling plate 531 and the transfer unit 540.

The transfer unit 540 drives the cooling plate 531. The transfer unit 540 moves the cooling plate 531 horizontally or vertically. The transfer unit 540 may move the cooling plate 531 to the first or second position. The first position is a position where the cooling plate 531 is near the first side wall 511. The second position is near the second side wall 513 and near the upper surface of the heating plate.

Figure 6:
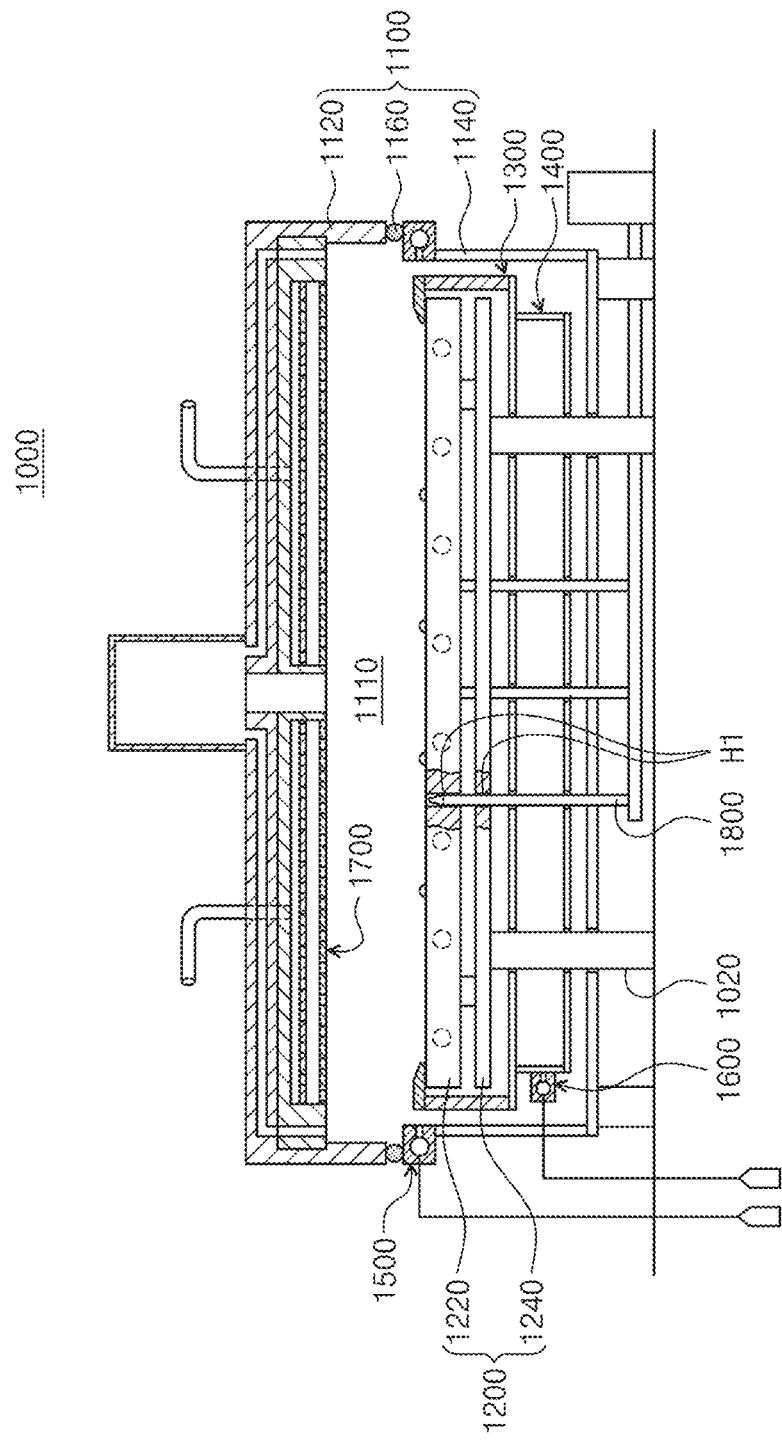
FIG. 6 show the bake unit of the heat treatment chamber of FIG. 5.

FIG. 6 illustrates the bake unit.

The bake unit 1000 conducts heat treatment on the substrate W. The bake unit 1000 conducts heat treatment on the substrate W before and after the photoresist solution is applied, respectively. The bake unit 1000 may heat the substrate W to a certain temperature before the photoresist solution is applied so as to transform the surface property of the substrate W, and a layer of treatment solution for example, adhesive, is formed on the surface of the substrate W.

Referring to FIG. 4 to FIG. 6, the bake unit 1000 heats the substrate W to a preset temperature. The bake unit 1000 includes a housing 1100, a heater 1200, a heater cup 1300, a heat insulation cup 1400, a first purge gas supply unit 1500, a second purge gas supply unit 1600, a baffle unit 1700, a lift pin 1800, and a driver 1900.

The housing 1100 can provide a processing space therein for the heat treatment of substrates W. The housing 1100 includes an upper cover 1120, a lower frame 1140, and a ceiling member 1160.

The upper cover 1120 is provided with lower side open. For example, the upper cover 1120 may be a cylinder shape with lower side open. The upper cover 1120 is provided over the heater 1200. The upper cover 1120 moves upwardly from the lower frame 1140 by the driver 1900 before the substrate W is transferred onto the heat plate 1220. For heating the substrate W by the heating plate 1200, the upper cover 1120 moves downwardly by the driver 1900 to form in combination with the lower frame 1140 a treating space wherein the substrate W is heated.

The driver 1900 is fixedly connected with the upper cover 1120 by a support part 1920. The driver 1900 moves the upper cover 1120 up and down in the case of when the substrate W is transferred to or from the heating plate 1220. In an embodiment the driver 1900 may be provided as a cylinder.

The lower frame 1140 is provided in the shape of a frame with its upper side open. For example, the lower frame 1140 may be a cylinder shape with its upper side open. The lower frame 1140 is situated below the upper cover 1120. The upper cover 1120 and the lower frame 1140 are placed to face each other in a top-down direction. The upper cover 1120 and the lower frame 1140 combine together to create a processing space 1110 above the heater. The lower frame may be provided in a partially open state in the lower side.

The ceiling member 1160 seals the gap between the upper cover 1120 and the lower frame 1140. The ceiling member 1160 is placed between the lower end of the upper cover 1120 and the upper end of the lower frame 1140. The ceiling member 160 can be an O ring member 1160 which has an annular ring shape. The ceiling member 1160 can fixedly combine with the lower end of the upper cover 1120.

The heater 1200 is provided inside the lower frame 1140. The heater 1220 may include a heating plate 1220 and a support plate 1240 which supports the heating plate 1220. The heating plate 1220 is provided therein with means for heating the substrate W. For example, a heating coil may be provided as heating means inside the heating plate 1220. Unlike this, heating patterns may be provided in the heating plate. The heater 1200 is provided in a cylinder shape. The heater 1200 has a pin hole (H1) for receiving lift pin 1800.

The pin hole (H1) provides a passage for lift pin 1800 to move vertically, thereby lifting up and down the substrate W. The pin hole (H1) is provided to penetrate the heating plate 1220 and a support plate 1240 vertically, and the pin hole (H) may be provided in plural number.

The lift pin 1800 moves vertically by the pin driver unit. The lift pin 1800 may be able to install the substrate W onto the heating plate 1220. The lift pin 1800 can vertically move the substrate W to a position that is a certain distance from the heating plate 1220.

A heater cup 1300 may be provided to surround the heater 1200. The heater cup 1300 can be installed to be spaced apart from the heater 1200. The heat insulation cup 1400 is installed at a certain distance away from the bottom surface of the heater cup 1300. The heater cup 1300 and the heat insulting cup 1400 have many through-holes and openings, through which outside gas can enter.

In an embodiment, the support member 1020 can be installed so as to support the heater 1200 through the through holes (H2) at the bottom side of the heater cup 1300 and the bottom side of the insulation cup 1400. Although not shown, the power and signal cables can be connected with the heater 1200 through the support member 1020 or the openings.

Figure 7:
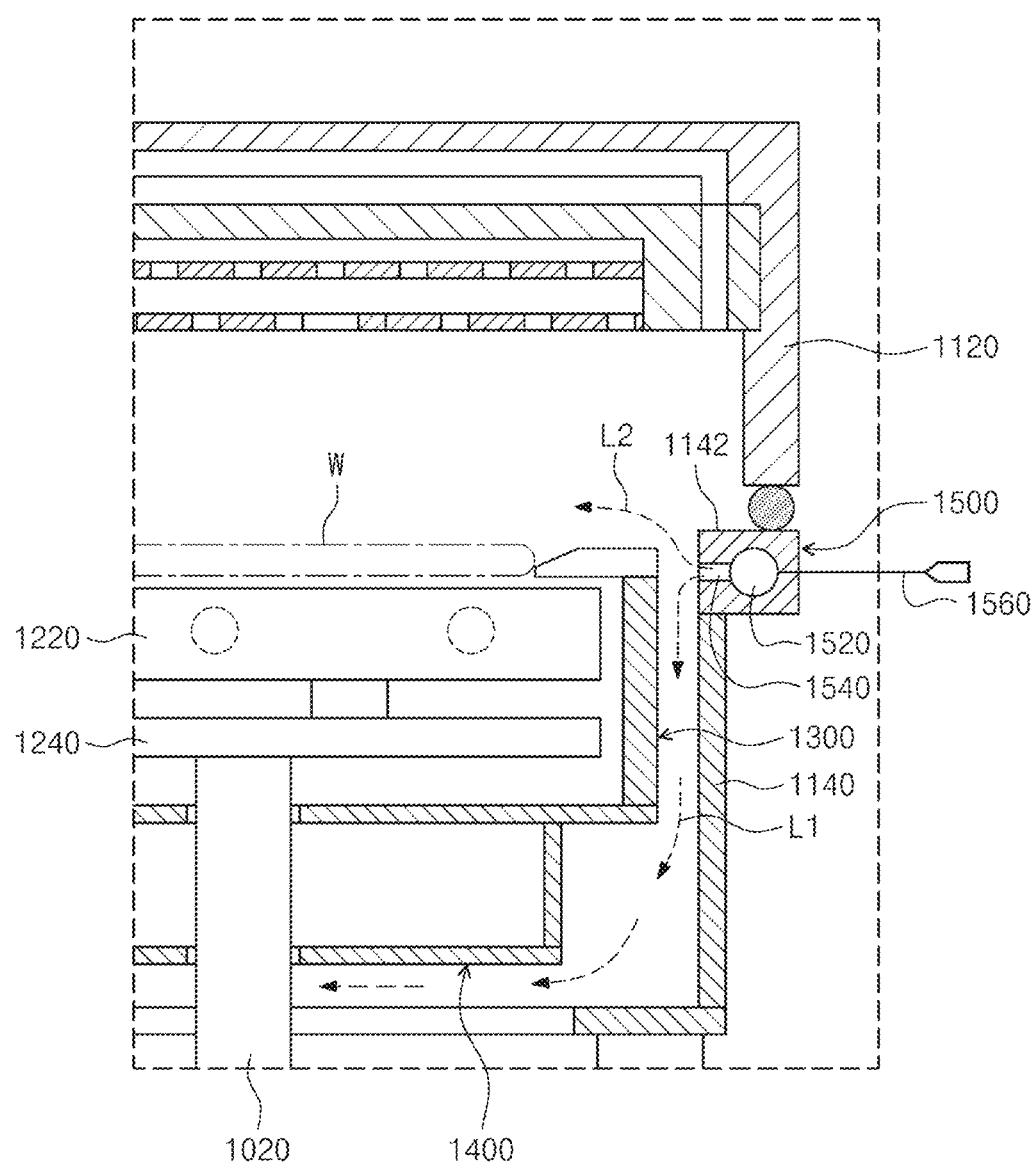
FIG. 7 is an enlarged view of the main parts to illustrate a first purge gas supply unit.

FIG. 7 is an enlarged view of the main parts, illustrating the first purge gas supply unit.

Referencing FIG. 7, the first purge gas supply unit 1500 provides a flow of first purge gas (L1; illustrated with arrow in FIG. 7) which blocks outside air from inflowing through a gap between lower frame 1140 and the heater cup 1300.

The first purge gas supply unit 1500 may include a gas input space 1520 at an upper end of the sidewall (flange: 1142) of the lower frame 1140 for inflowing the first purge gas, outlets 1540 which discharges the first purge gas inflowed into the gas input space 1520 into the gap between the heater cup 1300 and the lower frame 1140, and a supply line 1560 which supplies purge gas into the gas input space. The gas input space 1520 is provided in an annular ring shape along the flange of the lower frame 1140, and the outlets 1540 can be formed in certain intervals along the flange of the lower frame 1140. The outlet 1540 may be provided to face the side of the heater cup 1300.

Figure 8:
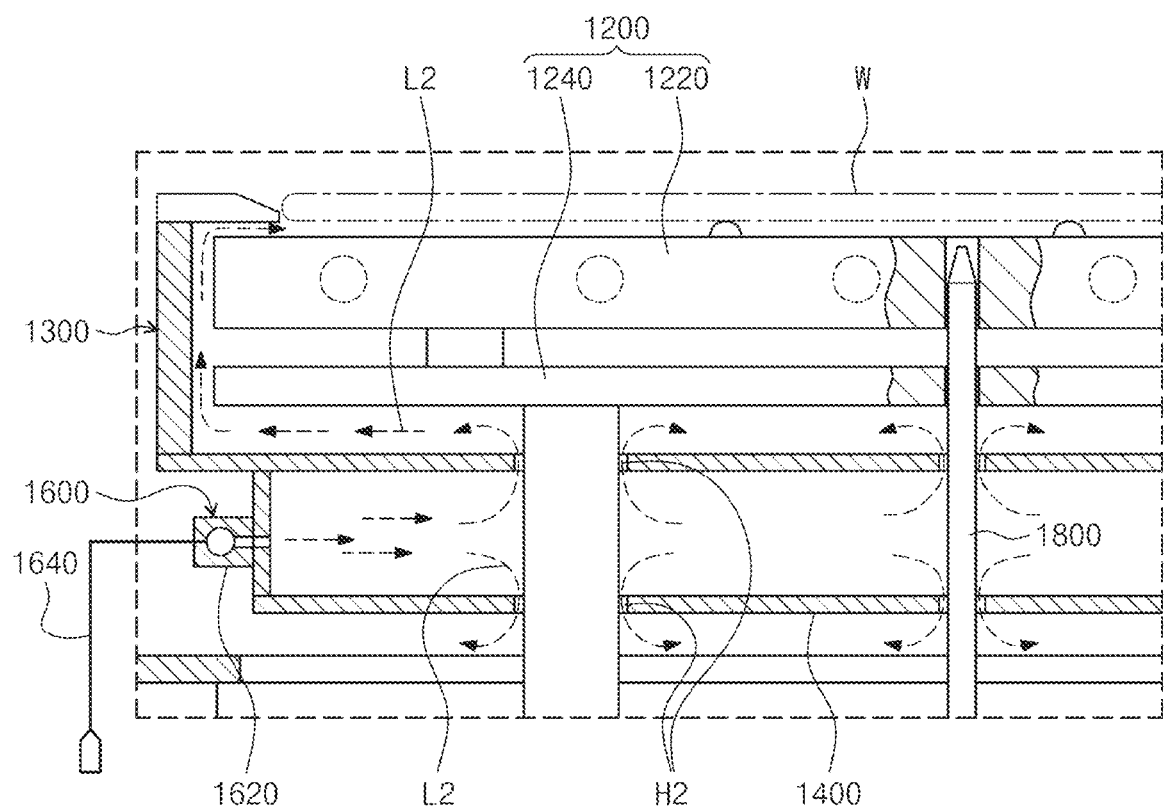
FIG. 8 is an enlarged view of the main parts to illustrate a second purge gas supply unit.

FIG. 8 is an enlarged view of the main parts to illustrate the second purge gas supply unit.

Referencing FIG. 8, the second purge gas supply unit 1600 provides the flow of second purge gas (L2; illustrated with arrow in FIG. 8) which blocks outside air from inflowing through the through-holes (H1) and opening formed in the lower frame 1140, heat insulation cup 1400, and the heater cup 1300. The second purge gas supply unit 1600 may include a supply port 1620 which supplies the second purge gas into inner space of the heat insulation cup 1400 and a supply line 1640 connected to the supply port 1620. Like this, the Etch Rate can be improved by supplying the purge gas into the heat insulation cup 1400, and dealing with the outer air flow which might directly affect the substrate with Non-Oxidation Gas (purge gas).

The bake unit 1000 according to an embodiment of the inventive concept can block the inflow of outer air by supplying purge gases from the first purge gas supply unit 1500 and the second purge gas supply unit 1600, therefore maintaining uniformly the environmental conditions of the processing space. The purge gas can be an inert gas with a constant temperature.

The bake unit of the embodiment of the inventive concept cannot increase the supply volume unlimitedly according to the relationship of THK Uniformity and Etch Rates following the volume of processing gas (upper unit volume). Instead, purge gas volume can be sufficiently supplied to the substrate by supplying purge gas through the first purge gas supply unit 1500 and the second purge gas supply unit 1600.

The amount of the purge gas supplied through the first and second purge gas supply units can be controlled, and the substrate etching rate can be regulated by controlling the supply amount of the purge gas.

Figure 9:
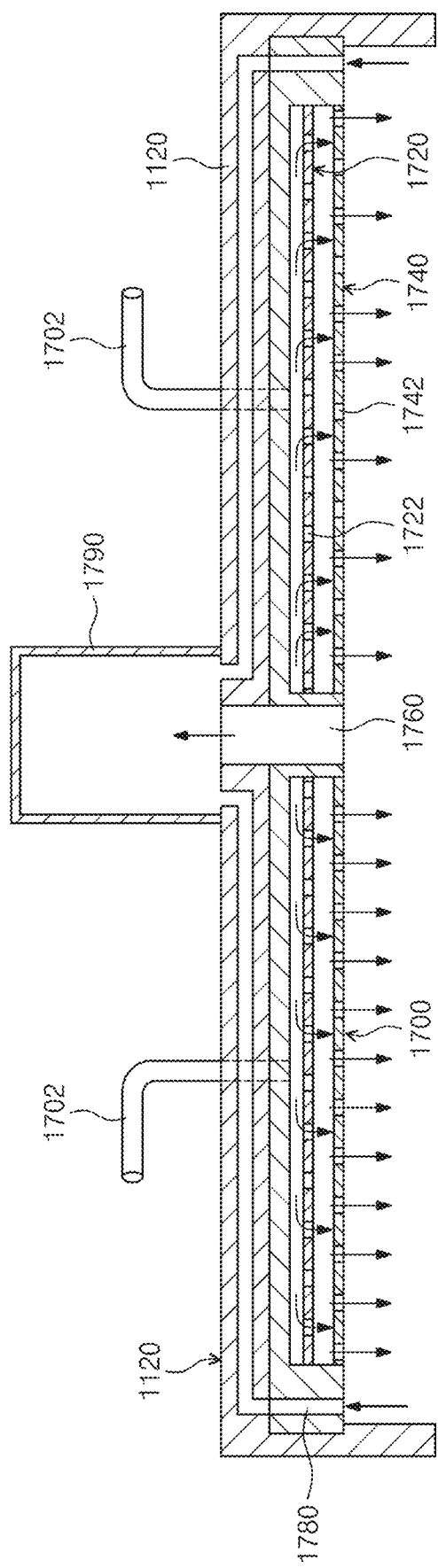
FIG. 9 schematically shows a baffle unit.

FIG. 9 shows a baffle unit.

According to FIG. 9, the baffle unit 1700 sprays processing gas onto the substrate placed on the heater 1200. The baffle unit 1700 may include an upper baffle plate 1720 and a lower baffle plate 1740. The upper baffle plate 1720 has a plurality of first spray holes 1722, and the lower baffle plate 1740 has a plurality of second spray holes 1742. It is preferable the first spray holes 1722 is relatively smaller in size and/or lower in number than the second spray holes 1742. The processing gas may be the same gas as the purge gas supplied through the first and second purge gas supply units.

Therefore, the baffle unit 1000 may increase the time required for the processing gas to pass through the upper baffle plate 1720 and therefore the processing gas may sufficiently absorb the heat provided from the heater.

The processing gas may be provided onto the substrate after going through a supply port 1702 formed at the upper side of the upper cover 1120, and consecutively going through first spray holes 1722 in the upper baffle plate, and then second spray holes 1742 of the lower baffle plate 1740. After being supplied in such a manner, the processing gas may be exhausted though the exhaust unit together with the fumes created from the substrate.

The exhaust unit of the baffle unit 1700 may include a central exhaust unit 1760 which creates the exhaust flow in the central area of the processing space and a peripheral exhaust unit 1780 which may create an exhaust flow in the periphery of the processing space.

The central exhaust unit 1760 may be provided at the central area of the baffle unit 1700 to oppose the central area of the processing space. The central exhaust unit 1760 connects to the exhaust duct 1790 of the upper cover 1120. The peripheral exhaust unit 1780 may be provided at the periphery of the baffle unit 1700 to oppose the periphery of the processing space. The peripheral baffle unit 1780 connects to the exhaust duct of the upper cover 1790.

As described in detail above, the bake unit 1000 according to an embodiment of inventive concept adopts multiple plates each of which has a plurality of holes thus can increase the uniformity in gas flow on the substrate, thereby increasing process throughput as compared to single plate.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A bake unit comprising:
a housing having an upper cover and a lower frame, the upper cover and the lower frame in combination providing a treatment space configured to heat a substrate;

a heater provided in the treatment space configured to heat a substrate placed thereon, the heater including a heating plate;

a heater cup configured to surround the heater including the heating plate and spacing the heater apart from the lower frame; and a first purge gas supply unit configured to provide a first purge gas flow to block inflow of outer air through a gap between the lower frame and the heater cup.

2. The bake unit of claim 1, wherein the first purge gas supply unit includes:

a gas input space provided at a sidewall of the lower frame configured to inflow a first purge gas flow; and outlets configured to discharge the inflowed first purge gas flow from the gas input space into a gap between the heater cup and the lower frame.

3. The bake unit of claim 2, wherein the outlets are provided to face a side of the heater cup.

4. A bake unit comprising:

a housing having an upper cover and a lower frame, the upper cover and the lower frame in combination providing a treatment space configured to heat a substrate;

a heater provided in the treatment space configured to heat a substrate placed thereon;

a heater cup configured to surround the heater; and a first purge gas supply unit configured to provide a first purge gas flow to block inflow of outer air through a gap between the lower frame and the heater cup a heat insulation cup spaced apart from a bottom surface of the heater cup; and a second purge gas supply unit configured to provide a second purge gas flow to block the inflow of outer air through a plurality of through-holes formed in a bottom side of the heat insulation cup and a bottom side of the heater cup.

5. The bake unit of claim 4, further comprising a support member configured to support the heater through the plurality of through-holes.

6. The bake unit of claim 4, wherein the heat insulation cup has an inner space, and the second purge gas supply unit is configured to supply the second purge gas flow into the inner space of the heat insulation cup.

7. The bake unit of claim 1, further comprising:

a baffle unit configured to spray a processing gas onto a substrate placed on the heater, and wherein the baffle unit includes:

an upper plate having a plurality of first spray holes; and a lower plate having a plurality of second spray holes, the lower plate disposed below the upper plate.

8. The bake unit of claim 7, wherein the first spray holes are relatively smaller in size and/or lower in number than the second spray holes.

9. The bake unit of claim 7, wherein the baffle unit further includes:

a central exhaust unit configured to form an exhaust flow in a central area of a processing space; and a peripheral exhaust unit configured to form an exhaust flow in a periphery of the processing space.

10. The bake unit of claim 4, wherein the first purge gas flow and the second purge gas flow are inert gasses with a constant temperature.

11. A bake unit comprising:

a housing having an upper cover and lower frame, the upper cover and the lower frame in combination providing a treatment space configured to heat a substrate;

a heater provided within the treatment space configured to heat a substrate displaced thereon;

a heater cup configured to surround the heater;

a heat insulation cup spaced apart from a bottom surface of the heater cup;

a plurality of support members configured to support the heater through a plurality of through-holes formed at a bottom aide of the heater cup and a bottom aide of the heat insulation cup;

a first purge Bas supply unit configured to provide a first purge gas flow to block inflow of outer air through a gap between the lower frame and the heater cup;

a second purge gas supply unit configured to provide a second purge gas flow to block inflow of outer air through the plurality of through-holes; and, a baffle unit configured a processing gas onto a substrate placed on the heater.

12. The bake unit of claim 11, wherein the first purge gas supply unit includes:

a gas input space provided at a sidewall of the lower frame configured to inflow a first purge gas flow; and outlets configured to discharge the inflowed first purge gas flow from the gas input space into a gap between the heater cup and the lower frame, the outlets facing the side of the heater cup.

13. The bake unit of claim 11, wherein the second purge gas supply unit is configured to supply the second purge gas flow into an inner space of the heat insulation cup.

14. The bake unit of claim 11, wherein the baffle unit comprises:

an upper plate having a plurality of first spray holes; and and a lower plate having a plurality of second spray holes, the lower plate disposed below the upper plate, wherein the first spray holes are relatively smaller in size and/or lower in number than the second spray holes.

15. The bake unit of claim 1, wherein the gap extends beneath the heater cup.

16. The bake unit of claim 1, wherein the heater further comprises:

a support plate between the heating cup and the heating plate.

17. The bake unit of claim 4, wherein the second purge gas supply unit is configured to supply the second purge gas flow between the heating cup and the heater.

18. The bake unit of claim 4, wherein the second purge gas supply unit is configured to supply the second purge gas flow over a top surface of the heater.

19. The bake unit of claim 4, wherein the second purge gas supply unit is attached to the heat insulation cup.

20. The bake unit of claim 7, wherein the process gas and the first purge gas flow are composed of the same gas.

* * * * *